(12) United States Patent
Fujisato et al.

(10) Patent No.: US 11,396,704 B2
(45) Date of Patent: Jul. 26, 2022

(54) SUBSTRATE HOLDER AND FILM FORMING APPARATUS

(71) Applicant: TOKYO ELECTRON LIMITED, Tokyo (JP)

(72) Inventors: Toshiaki Fujisato, Nirasaki (JP); Takashi Mochizuki, Nirasaki (JP); Daisuke Toriya, Nirasaki (JP); Kouki Suzuki, Nirasaki (JP); Hwajun Noh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 16/698,381

(22) Filed: Nov. 27, 2019

(65) Prior Publication Data
US 2020/0165723 A1 May 28, 2020

(30) Foreign Application Priority Data

Nov. 27, 2018 (JP) .............................. JP2018-221311

(51) Int. Cl.
*C23C 16/458* (2006.01)
*C23C 16/455* (2006.01)
*C23C 16/50* (2006.01)

(52) U.S. Cl.
CPC .... *C23C 16/4586* (2013.01); *C23C 16/45536* (2013.01); *C23C 16/45544* (2013.01); *C23C 16/50* (2013.01)

(58) Field of Classification Search
CPC ............ C23C 16/4583; C23C 16/4584; C23C 16/4585; C23C 16/4586; C23C 16/463
See application file for complete search history.

(56) References Cited

U.S. PATENT DOCUMENTS

2001/0043452 A1* 11/2001 Divakar .............. H01L 21/6833
  361/234
2005/0284371 A1* 12/2005 McFadden ............ C23C 16/455
  427/248.1
(Continued)

FOREIGN PATENT DOCUMENTS

JP    567673 A    3/1993
JP   7130830 A    5/1995
(Continued)

OTHER PUBLICATIONS

"Full-text Effective Database of Enterprise Essays (Master) Engineering Technology Series 1", 2017, Issue 6.

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A substrate holder according to one embodiment of the present disclosure comprises a stage made of a dielectric material and configured to support a substrate; an attraction electrode provided in the stage and configured to electrostatically attract the substrate; and a heater configured to heat the stage. By applying a DC voltage to the attraction electrode, the substrate is electrostatically attached to a surface of the stage by a Johnsen-Rahbek force. The stage comprises an annular close contact area with which the substrate comes into close contact at a position corresponding to an outer periphery of the substrate on the surface of the stage; and a groove provided in an annular shape in a portion outside the close contact area, and a conductive deposition film formed by the raw material gas is accumulated in the groove.

19 Claims, 5 Drawing Sheets

(56) References Cited

U.S. PATENT DOCUMENTS

Figure 1:
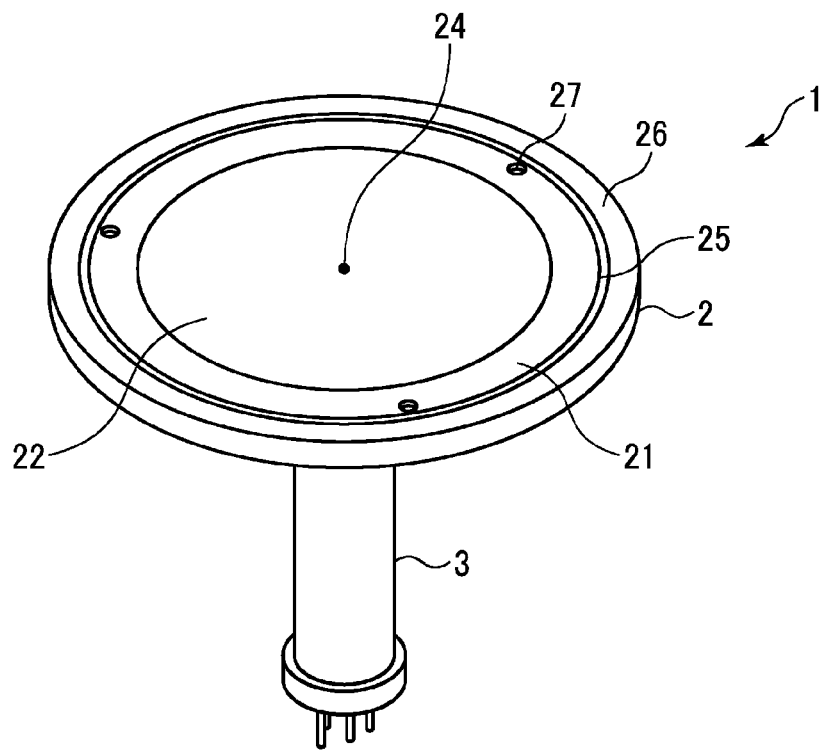
Figure 2:
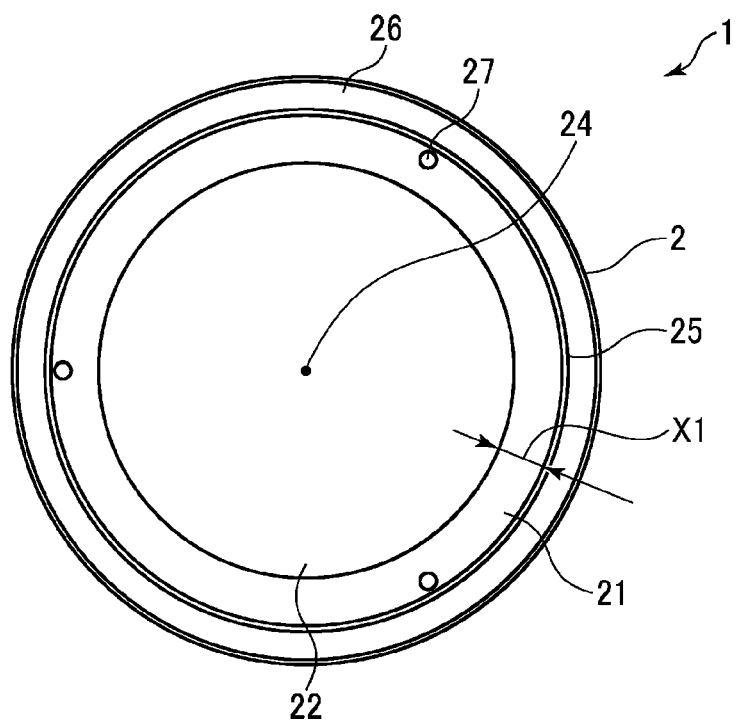
Figure 3:
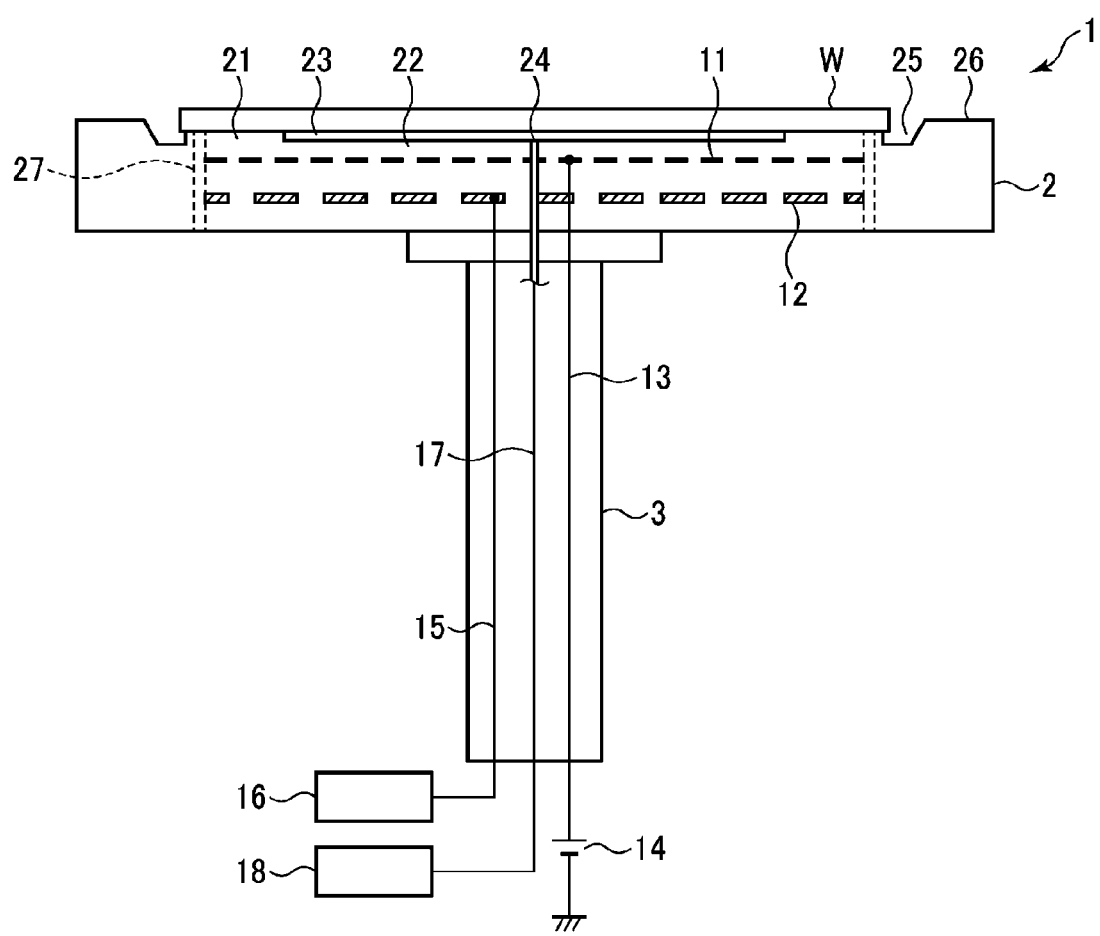

| | | | | |
|---|---|---|---|---|
| 2007/0037390 A1* | 2/2007 | Tsuji | ................ | C23C 16/401 |
| | | | | 438/680 |
| 2007/0283891 A1* | 12/2007 | Okayama | .......... | H01L 21/67109 |
| | | | | 118/728 |
| 2017/0076915 A1* | 3/2017 | Boyd, Jr. | ............ | H01L 21/6833 |
| 2017/0372928 A1* | 12/2017 | Yamada | ................ | C23C 16/463 |

FOREIGN PATENT DOCUMENTS

| | | | |
|---|---|---|---|
| JP | 9260472 | A | 10/1997 |
| JP | 2003297912 | A | 10/2003 |
| JP | 200921592 | A | 1/2009 |
| KR | 10-2007-0054766 | A | 5/2007 |
| KR | 10-2018-0061499 | A | 6/2018 |
| KR | 10-2018-0108470 | A | 10/2018 |

\* cited by examiner

SUBSTRATE HOLDER AND FILM FORMING APPARATUS

CROSS-REFERENCE TO RELATED APPLICATION

This application is based upon and claims the benefit of priority from Japanese Patent Application No. 2018-221311, filed on Nov. 27, 2018, the entire contents of which are incorporated herein by reference.

TECHNICAL FIELD

The present disclosure relates to a substrate holder and a film forming apparatus.

BACKGROUND

In a semiconductor device manufacturing process, plasma processing such as dry etching, sputtering, or plasma CVD is frequently used for a semiconductor wafer as a substrate.

In such plasma processing, an electrostatic chuck using electrostatic attraction is frequently used to hold a substrate (e.g., Patent Documents 1 to 5).

When a conductive film is formed by an isotropic film forming method such as plasma CVD or plasma ALD, a raw material gas moves around to a holding surface of the substrate and a conductive deposition film is formed on the holding surface, and thus there is a concern that the function of the electrostatic chuck may not be exhibited. Therefore, when a conductive film is formed through plasma CVD or plasma ALD, plasma processing is performed in the state in which a substrate is placed on a substrate placement stage without using an electrostatic chuck.

PRIOR ART DOCUMENTS

Patent Documents

Patent Document 1: Japanese Laid-open Publication No. 5-67673

Patent Document 2: Japanese Laid-open Publication No. 7-130830

Patent Document 3: Japanese Laid-open Publication No. 9-260472

Patent Document 4: Japanese Laid-open Publication No. 2003-297912

Patent Document 5: Japanese Laid-open Publication No. 2009-21592

SUMMARY

A substrate holder according to one embodiment of the present disclosure holds a substrate when a conductive film is formed by plasma CVD or plasma ALD. The substrate holder comprises a stage made of a dielectric material and configured to support the substrate; an attraction electrode provided in the stage and configured to electrostatically attract the substrate; and a heater configured to heat the stage. By applying a DC voltage to the attraction electrode, the substrate is electrostatically attached to a surface of the stage by a Johnsen-Rahbek force. The stage comprises an annular close contact area with which the substrate comes into close contact at a position corresponding to an outer periphery of the substrate on the surface of the stage such that a raw material gas for forming the conductive film is prevented from flowing to a rear side of the substrate; and a groove provided in an annular shape in a portion outside the close contact area, and a conductive deposition film formed by the raw material gas is accumulated in the groove.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a perspective view illustrating a substrate holder according to an embodiment.

FIG. 2 is a plan view showing a substrate holder according to the embodiment.

FIG. 3 is a cross-sectional view illustrating the substrate holder according to the embodiment.

FIG. 4 is a cross-sectional view illustrating a main part of the substrate holder according to the embodiment in an enlarged scale.

FIG. 5 is a cross-sectional view illustrating a part of a substrate holder according to another embodiment.

FIG. 6 is a cross-sectional view illustrating a modification of the substrate holder according to the other embodiment illustrated in FIG. 5.

FIG. 7 is a cross-sectional view illustrating another modification of the substrate holder according to the other embodiment illustrated in FIG. 5.

FIG. 8 is a cross-sectional view illustrating a film forming apparatus to which a substrate holder according to an embodiment is applied.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described in detail with reference to the accompanying drawings.

<Substrate Holder>

First, a substrate holder according to an embodiment is described. FIG. 1 is a perspective view illustrating a substrate holder 1 according to an embodiment, FIG. 2 is a plan view thereof, FIG. 3 is a cross-sectional view thereof, and FIG. 4 is a cross-sectional view illustrating a main part thereof in an enlarged scale.

A substrate holder 1 holds a wafer within a chamber maintained in a vacuum in a film forming apparatus that forms a conductive film on a semiconductor wafer (hereinafter, simply referred to as a "wafer"), which is a substrate, by plasma CVD or plasma ALD. The conductive film that is formed may be, for example, a Ti film, a TiN film, a W film, or a Ni film.

The substrate holder 1 includes a stage 2 to place (support) thereon a wafer W, which is a substrate, and a support 3 installed on the center of the bottom side of the stage 2, the support extending downwards.

The stage 2 is made of a dielectric material, for example, ceramic such as aluminum nitride (AlN). Inside the stage 2, an attraction electrode 11 is embedded in the vicinity of the surface of the stage 2 to electrostatically attract the wafer W, and constitutes an electrostatic chuck. The attraction electrode 11 is made of, for example, Mo, and takes, for example, a mesh form. A DC power supply 14 is connected to the attraction electrode 11 via a power feeding line 13, and a DC voltage is applied to the attraction electrode 11 to electrostatically attract the wafer W. The DC power supply 14 is configured to be turned ON/OFF by a switch (not illustrated). The attraction electrode 11 also functions as a ground electrode for plasma.

A heater 12 is embedded below the attraction electrode 11 inside the stage 2. A heater power supply 16 is connected to the heater 12 via a power feeding line 15, and the output of the heater 12 and the temperature of the stage 2 are controlled on the basis of a detection value of a temperature sensor (not illustrated) such as a thermocouple.

On the surface of the stage 2, a close contact area 21, with which the wafer W comes into close contact, is formed in an annular shape at a position corresponding to the outer periphery of the wafer W. The close contact area 21 is configured to prevent a raw material gas for forming a conductive film from flowing to the reverse side of the wafer W. This makes it possible to avoid or reduce the formation of a conductive deposition film on the rear surface of the wafer. From the viewpoint of exhibiting such a function, the width X1 of the close contact area 21 is preferably 10 to 40 mm. The close contact area 21 is formed to have an outer diameter smaller than the diameter of the wafer W. This is because depositions get on the wafer W if the outer diameter of the contact area 21 is larger than the diameter of the wafer W.

Inside the close contact area 21, an attraction surface 22 configured to attract the wafer W is formed to be lower than the adhesion area 21 by about 20 to 70 μm, thereby forming a recess. The attraction surface 22 is, for example, an embossed surface that has been embossed. A space 23 is formed between the attraction surface 22 and the rear surface of the wafer. A gas inlet 24 is formed in the attraction surface 22, and a backside gas supplied from the gas supply source 18 through a gas supply path 17 is adapted to be supplied from the gas inlet 24 into the space 23. The gas supply source 18, the gas supply path 17, and the gas inlet 24 constitute a backside gas supply. As the backside gas, a gas having high thermal conductivity, such as helium (He) gas, is used, and the heat of the stage 2 is transferred to the wafer W through the backside gas.

The gas pressure of the backside gas is preferably set as high as 20 to 100 Torr. In this manner, it is possible to avoid or reduce infiltration of the raw material gas to the reverse surface of the wafer W by increasing the amount of leaking gas.

Figure 4:
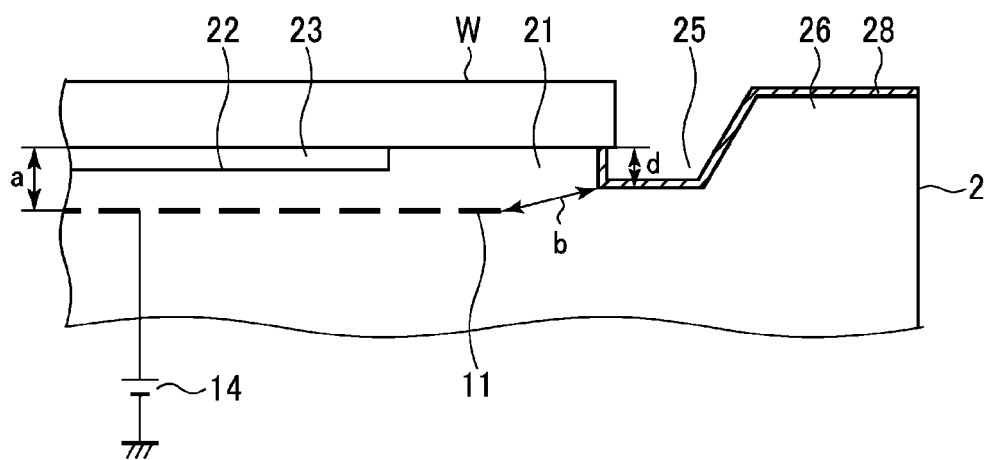

In the portion outside the close contact area 21 in the surface of the surface of the stage 2, a groove 25 is formed in an annular shape, in which a conductive deposition film is capable of being accumulated by the raw material gas for forming the conductive film. A conductive deposition film is deposited on the portion outside the close contact area 21 in the surface of the stage 2. However, the conductive deposition film 28 is accumulated in the groove 25 by providing the groove 25 as illustrated in FIG. 4. For this reason, even if the conductive deposition film 28 increases over time, for example, in the case in which transfer deviation of the wafer W occurs, it is possible to avoid or reduce the formation of the conductive deposition film in the close contact area 21 and to avoid or reduce the release of electric charges of the electric chuck. From such a viewpoint, the depth of the groove 25 from the close contact area 21 (distance d (see FIG. 4)) is preferably in the range of 20 to 100 μm, for example, 50 μm. In addition, the width of the groove 25 is preferably in the range of 0.5 to 2 mm.

A portion of the surface of the stage 2 outside the groove portion 25 is formed to be higher than the close contact area 21 and serves as a guide portion 26 that guides the wafer W. In addition, the side wall portion connected from the groove 25 to the guide portion 26 has, for example, a tapered shape.

Lift pin insertions holes 27 penetrating in the vertical direction are formed outside the close contact area 21 of the stage 2. Lift pins (not illustrated) are inserted into respective lift pin insertion holes 27 so as to be movable up and down, and the lift pins protrude from the wafer placement surface (the surface of the close contact area 21) during the delivery of the wafer to the stage 2.

From the viewpoint of effectively correcting the warp of the wafer W, which is a substrate, the wafer W is attracted by a Johnsen-Rahbek force by supplying power to the attraction electrode 11. The attraction of the wafer W using the Johnsen-Rahbek force is performed by making the dielectric material constituting the stage 2 have somewhat conductive with a volume resistivity of about $1 \times 10^9$ to $1 \times 10^{12}$ Ω·cm at the film forming temperature and enabling charge movement. Due to the use of the Johnsen-Rahbek force, it is possible to increase the amount of accumulated charges so as to obtain an attraction force higher than a Coulomb force. Due to the use of AlN as the dielectric material, it is possible to obtain the volume resistivity in the above-mentioned range, and to effectively exhibit the Johnsen-Rahbek force. Depending on the used temperature, by adding an appropriate additive to AlN, it is possible to adjust the volume resistivity at which the Johnsen-Rahbek force is capable of being effectively exhibited. In order to effectively attract the wafer by the Johnsen-Rahbek force, the distance a from the attraction electrode 11 to the attraction surface of the wafer W is preferably set to 0.5 to 1.5 mm.

The temperature of the surface of the stage 2 heated by the heater 12, that is, the film forming temperature of the wafer W is preferably 200 degrees C. or higher. When the heating temperature is 200 degrees C. or higher, the warpage of the wafer W, which is the substrate, is likely to increase, and thus the need of a function as an electrostatic chuck is increased. More preferably, the heating temperature is 400 degrees C. or higher, and further 400 to 700 degrees C.

As illustrated in FIG. 4, it is preferable to provide the attraction electrode 11 such that the distance "b" between the attraction electrode 11 and the conductive deposition film 28 formed outside the close contact area 21 is larger than the distance "a" between the wafer W and the attraction electrode 11 (that is, b>a). As a suitable example, "a" is 1 mm, and "b" is 2 mm or more. This makes it possible to effectively avoid or reduce leakage current to the conductive deposition film 28.

Figure 5:
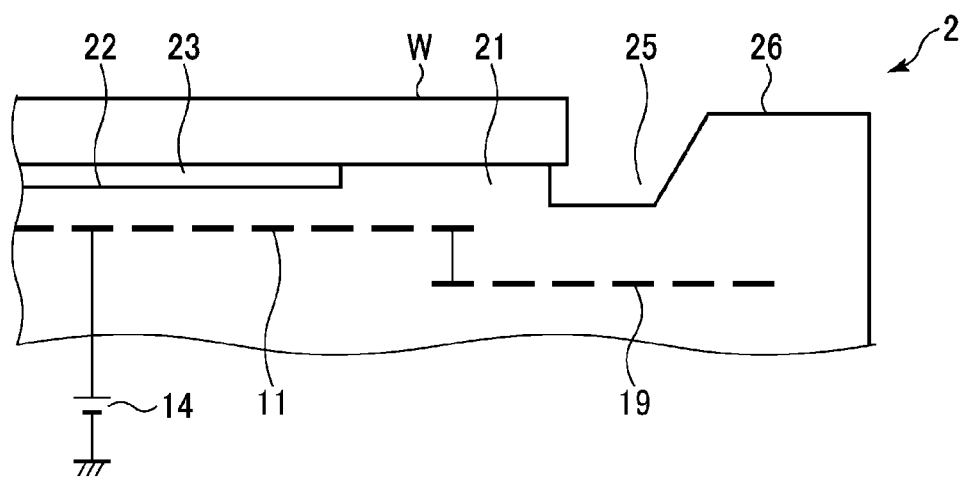

As described above, the attraction electrode 11 also functions as a plasma ground electrode. However, since the diameter of the attraction electrode 11 is limited so as to satisfy b>a, the plasma area also corresponds to the diameter of the attraction electrode 11. Therefore, when it is desired to further expand the plasma area, an auxiliary electrode 19 may be provided outside the attraction electrode 11 so as to be electrically connected to the attraction electrode 11, as illustrated in FIG. 5.

Figure 6:
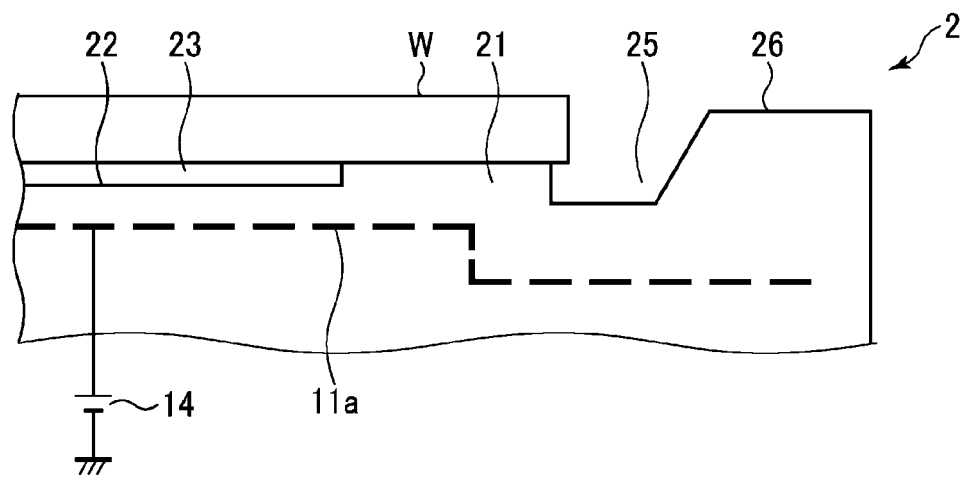
Figure 7:
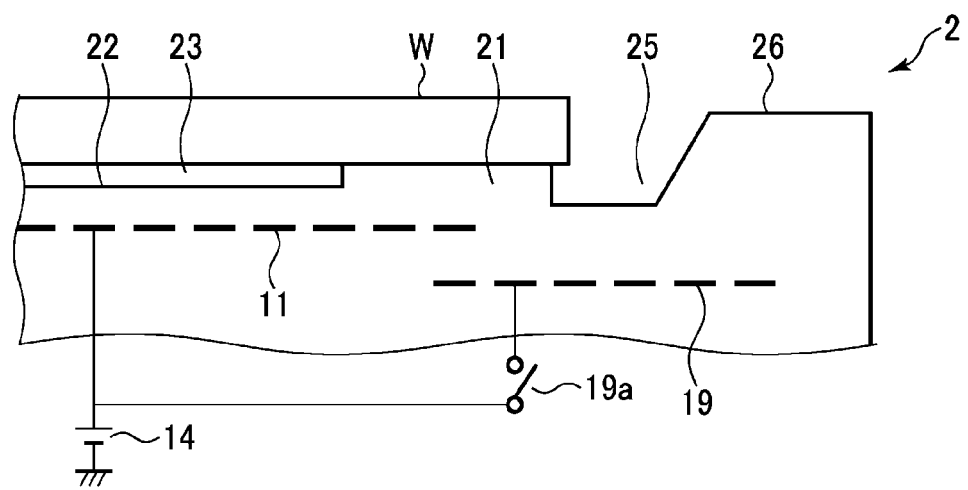

In this case, the auxiliary electrode 19 is provided at a position sufficiently spaced apart from the conductive deposition film 28 below the attraction electrode 11 (that is, a position at which the distance between the auxiliary electrode 19 and the conductive deposition film 28 is greater than the distance a (see FIG. 4)). In addition, as illustrated in FIG. 6, an attraction electrode 11a in which the auxiliary electrode is integrated may be provided. Furthermore, as illustrated in FIG. 7, ON/OFF of the auxiliary electrode 19 may be switched by a switch 19a.

Next, the acting effects of the substrate holder 1 configured as described above are described.

When performing plasma processing on a substrate such as a wafer, an electrostatic chuck has been conventionally used to attract the substrate. When a conductive film is formed by an isotropic film forming method such as plasma CVD or plasma ALD, a raw material gas flows to a holding surface of the substrate and a conductive deposition film is formed on the holding surface, and thus the function of the electrostatic chuck may not be exhibited. For this reason, there is a concern that the electrostatic chuck function is not exhibited. For this reason, when a conductive film is formed by plasma CVD or plasma ALD, an electrostatic chuck has not been used.

However, recently, with the development of device generations, by changing devices and adopting new device materials, a wafer is easily warped, and the warpage of the wafer causes deterioration of uniformity and arcing between the wafer and the stage.

Therefore, in the present embodiment, the wafer W, which is a substrate, is made to be electrostatically attracted in the substrate holder used when a conductive film is formed by plasma CVD or plasma ALD.

That is, the substrate holder 1 includes a stage 2, which is made of a dielectric material and on which the wafer W is placed, and an attraction electrode 11 for electrostatically attracting the wafer W provided on the stage. The wafer W is attracted by a Johnsen-Rahbek force. In addition, the stage 2 has an annular close contact area 21 at a position corresponding to the outer periphery of the wafer W on the surface thereof. The close contact area 21 has a function of preventing the raw material gas for forming the conductive film from flowing to the rear surface side of the wafer W by bringing the wafer W into close contact with the close contact area 21. In addition, the stage 2 has a groove 25 provided in an annular shape in the portion outside the close contact area 21 in the surface thereof so as to enable accumulation of a conductive deposition film formed by a raw material gas for forming the conductive film.

As described above, since the close contact area 21, which functions to increase the attraction force of the wafer W by the Johnsen-Rahbek force and to prevent the raw material gas from flowing to the rear surface of the wafer W, and a groove 25, which is located outside the close contact area 21 and enables accumulation of a conductive deposition film, are provided, it is possible to avoid or reduce formation of a conductive deposition film on the rear surface of the wafer W. For this reason, in the formation of the conductive film through plasma CVD or plasma ALD, it is possible to make it difficult for leakage current to occur, and thus it is possible to reliably electrostatically attract the wafer W. In addition, since it is possible to electrostatically attract the wafer W with a high attracting force by the Johnsen-Rahbek force in this way, even when the wafer W is warped, it is possible to attract and hold the wafer W in the state in which the warp is corrected.

Since the warpage of the wafer W tends to increase when the heating temperature of the stage 2 by the heater 12, that is, the film forming temperature of the wafer W, is 200 degrees C. or higher, the heating temperature is preferably 200 degrees C. or higher. More preferably, the heating temperature is 400 degrees C. or higher, and further 400 to 700 degrees C.

The width X1 of the close contact area 21 is preferably 10 to 40 mm Thereby, it is possible to enhance the effect of hindering the raw material gas from flowing to the rear surface of the wafer W, and to effectively avoid or reduce the formation of the conductive deposition film on the rear surface of the wafer W. In addition, by setting the depth of the groove 25 in the range of 20 to 100 μm and the width of the groove 25 in the range of 0.5 to 2 mm, it is possible to further enhance the effect of avoiding or reducing the formation of the conductive deposition film on the close contact area 21.

In addition, during the electrostatic attraction of the wafer W, when the gas pressure of backside gas for heat transfer introduced into the space 23 on the reverse side of the wafer is set as high as 30 to 70 Torr, it is possible to more effectively avoid or reduce the infiltration of the raw material gas to the rear surface of the wafer W by increasing the amount of leaking gas.

In addition, it is preferable to provide the attraction electrode 11 such that the relationship between the distance "b" between the attraction electrode 11 and the conductive deposition film 28 formed outside the close contact area 21 and the distance "a" between the wafer W and the attraction electrode 11 becomes b>a. This makes it possible to effectively avoid or reduce leakage current to the conductive deposition film 28, and to avoid or reduce functional degradation of the electrostatic chuck.

Furthermore, by causing the attraction electrode 11 to function as a plasma ground electrode, it is not necessary to provide a separate ground electrode, and thus it is possible to reduce the space for the electrode and wiring.

In this case, although the plasma area is limited to the diameter of the attraction electrode 11 formed to satisfy b>a, it is possible to expand the plasma area by providing an auxiliary electrode at a position sufficiently spaced apart from the conductive deposition film 28 outside the attraction electrode 11.

<Film Forming Apparatus>

Next, a film forming apparatus to which a substrate holder according to an embodiment is applied is described.

Figure 8:
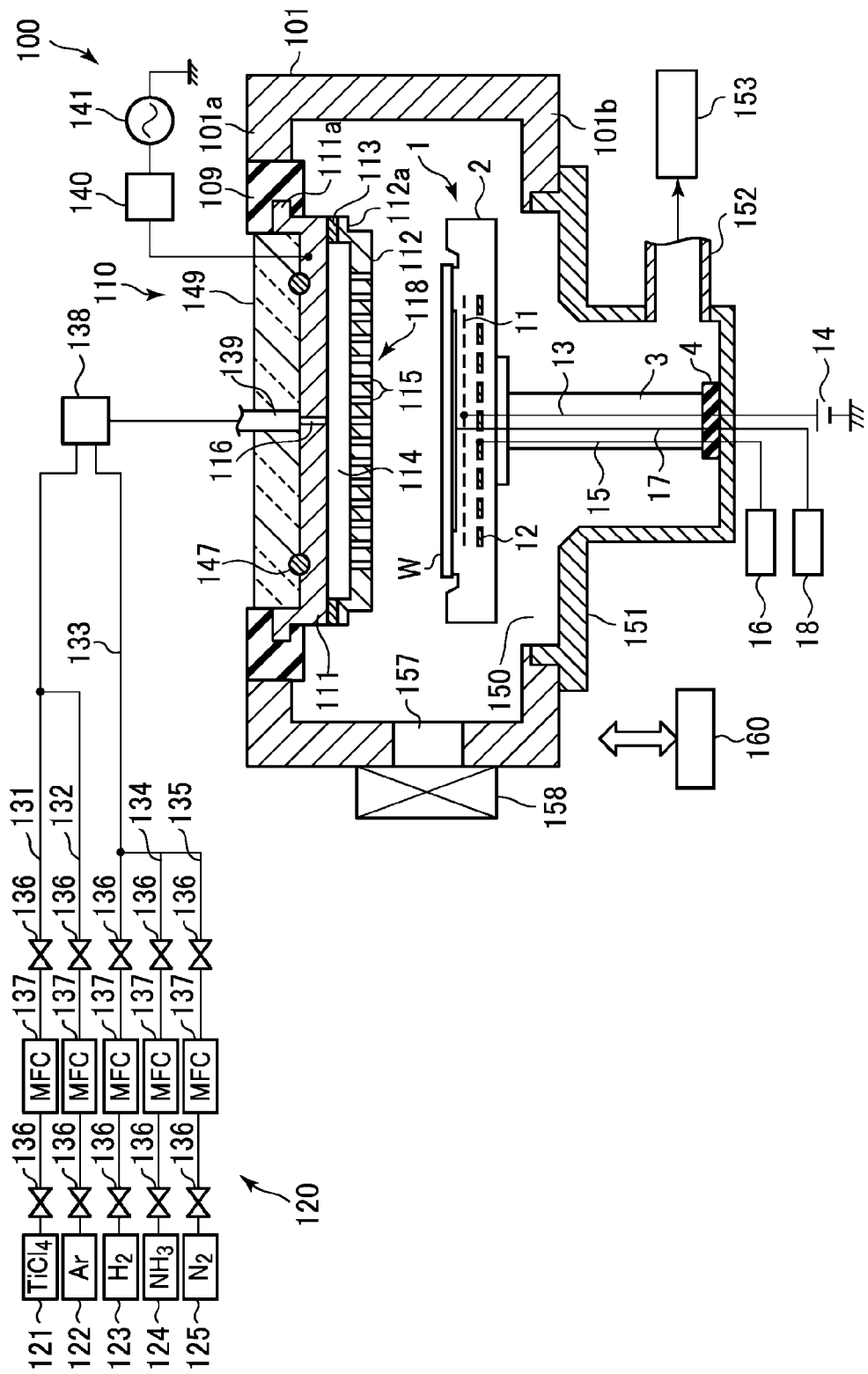

FIG. 8 is a cross-sectional view illustrating a film forming apparatus to which a substrate holder according to an embodiment is applied.

A film forming apparatus 100 forms a Ti film through plasma CVD or plasma ALD by forming a high-frequency electric field on parallel plate electrodes.

The film forming apparatus 100 has a metal chamber 101 having a substantially cylindrical shape. The chamber 101 has an exhaust chamber 151 that protrudes downwards so as to cover a circular hole 150 formed in the central portion of the bottom wall 101b of the main body. An exhaust pipe 152 is connected to the side surface of the exhaust chamber 151, and an exhauster 153 having a pressure control valve and a vacuum pump is provided in the exhaust pipe 152. The exhauster 153 is configured to be capable of evacuating the inside of the chamber 101 and controlling the pressure in the chamber 101 to a reduced pressure state of a predetermined pressure.

The side wall of the chamber 101 is provided with a loading/unloading port 157 for loading/unloading a wafer W to/from a wafer transfer chamber (not illustrated) provided adjacent to the chamber 101 and a gate valve 158 for opening/closing the loading/unloading port 157.

Inside the chamber 101, a substrate holder 1 according to an embodiment for attracting and holding a wafer W, which is a substrate, is provided. Since the substrate holder 1 has the above-described configuration, a description thereof is omitted. The support 3 of the substrate holder 1 is provided on the bottom wall of the exhaust chamber 151 via an insulating member 4.

On the ceiling wall 101a of the chamber 101, a shower head 110 that also functions as an upper electrode of parallel plate electrodes is provided via an insulating member 109 so as to face the stage 2 of the substrate holder 1. The shower head 110 functions as a gas introduction part. The shower head 110 includes a base member 111 and a shower plate 112, and the outer periphery of the shower plate 112 is screwed to the base member 111 via an annular intermediate member 113. The shower plate 112 has a disk shape, and a flange is formed on the outer periphery thereof. In addition, a gas diffusion space 114 is formed between the base member 111 and the shower plate 112. The base member 111 has a flange portion 111a formed on the outer periphery thereof, and the flange portion 111a is supported by the insulating member 109. The shower plate 112 has a gas ejection surface 118 facing a susceptor 2, and a plurality of gas ejection holes 115 are formed in the shower plate 112. One gas introduction hole 116 is formed near the center of the base member 111. A gas pipe of a gas supply mechanism 120 to be described later is connected to the gas introduction hole 116, and the processing gas supplied from the gas supply mechanism 120 is introduced into the chamber 101 through the shower head 110 in a shower form.

The base member 111 of the shower head 110 is provided with a heater 147 for heating the shower head 110. The heater 147 is supplied with power from a heater power source (not illustrated), and heats the shower head 110 to a desired temperature. A heat insulating member 149 is provided in a recess formed in the upper portion of the base member 111.

The gas supply mechanism 120 includes a $TiCl_4$ gas supply source 121, an Ar gas supply source 122, an $H_2$ gas supply source 123, an $NH_3$ gas supply source 124, and an $N_2$ gas supply source 125. $TiCl_4$ gas is used as a Ti raw material gas. Ar gas is used as a plasma generation gas, a carrier gas, and a purge gas. $H_2$ gas is used as a reducing gas, $NH_3$ gas is used as a nitriding gas, and $N_2$ gas is used as a purge gas.

The $TiCl_4$ gas supply source 121, the Ar gas supply source 122, the $H_2$ gas supply source 123, the $NH_3$ gas supply source 124, and the $N_2$ gas supply source 125 are connected to a $TiCl_4$ gas supply line 131, an Ar gas supply line 132, an $H_2$ gas supply line 133, an $NH_3$ gas supply line 134, and an $N_2$ gas supply line 135, respectively. In addition, each gas line is provided with a mass flow controller 137 and two opening/closing valves 136 before and after the mass flow controller 137.

The Ar gas supply line 132 is connected to the $TiCl_4$ gas supply line 31, and the $NH_3$ gas supply line 134 and the $N_2$ gas supply line 135 are connected to the $H_2$ gas supply line 133. The $TiCl_4$ gas supply line 131 and the $H_2$ gas supply line 133 are connected to a gas mixing part 138, and the mixed gas mixed thereby is connected to the gas introduction hole 116 through a gas pipe 139. The mixed gas reaches the gas diffusion space 114 through the gas introduction hole 116, and is ejected in a shower form towards the wafer W in the chamber 101 through the gas ejection holes 115 in the shower plate 112.

A high-frequency power supply 141 is connected to the shower head 110 via a matching device 140, and high-frequency power is supplied from the high-frequency power supply 141 to the shower head 110. The shower head 110 functions as an upper electrode of parallel plate electrodes. Meanwhile, the attraction electrode 11 provided in the stage 2 of the substrate holder 1 functions as a lower electrode (ground electrode) of the parallel plate electrodes. Accordingly, by supplying high-frequency power to the shower head 110, a high-frequency electric field is formed between the shower head 110 and the attraction electrode 11, and the processing gas ejected from the shower head 110 is turned into plasma by this high-frequency electric field. That is, the high-frequency power supply 141 functions as a plasma generator. The frequency of the high-frequency power supply 141 is preferably set to 200 kHz to 13.56 MHz, and typically 450 kHz is used.

The film forming apparatus 100 includes a controller 160 that controls the components thereof, such as the substrate holder 1, the valve 136, the mass flow controller 137, the matching device 140, and the high-frequency power supply 141. The controller 160 includes a CPU (computer), and includes a main controller that controls each of the above-mentioned components, an input device, an output device, a display device, and a storage device. In the storage device, a storage medium, which stores programs for controlling processing to be executed in the film forming apparatus 100, that is, processing recipes, is set, and the main controller reads a predetermined processing recipe stored in the storage medium and performs control such that predetermined processing is performed by the film forming apparatus 100 on the basis of the processing recipe.

Next, processing for forming a Ti film, performed using the film forming apparatus 100 described above, will be described.

First, after adjusting the pressure in the chamber 101, the gate valve 158 is opened, a wafer W is loaded into the chamber 101 from a transport chamber (not illustrated) through the loading/unloading port 157, and the wafer W is placed on the surface of the stage 2 maintained at a predetermined temperature. Then, preflow is performed by causing Ar gas as a plasma generation gas, $H_2$ gas as a reducing gas, and $TiCl_4$ gas as a Ti raw material gas to flow through a preflow line (not illustrated). Next, the lines are switched to film forming lines in the state of maintaining the gas flow rates and pressures the same, and these gases are simultaneously or sequentially introduced into the chamber 101 through the shower head 110.

Then, after the introduction of these gases is started, high-frequency power is applied from the high-frequency power supply 41 to the shower head 110, and plasma is generated in the chamber 101 at a predetermined timing. At the same time, a DC voltage is applied to the attraction electrode 11 from the DC power supply 14 to cause the wafer W to be electrostatically attached to the stage 2 by a Johnsen-Rahbek force.

Then, while introducing Ar gas, $H_2$ gas, and $TiCl_4$ gas sequentially or at a predetermined timing, plasma is generated continuously or at a predetermined timing, and a Ti film is formed on the surface of the wafer W through plasma CVD or plasma ALD. That is, in the case of plasma CVD, plasma is continuously generated in the chamber 101 by the high-frequency power supply 41 while introducing Ar gas, $H_2$ gas, and $TiCl_4$ gas into the chamber 101. In the case of plasma ALD, while Ar gas and $N_2$ gas are continuously supplied, TiCl$_4$ gas and H$_2$ gas are alternately supplied, and plasma is generated, for example, at the timing of supplying the H$_2$ gas.

At this time, the temperature of the surface of the stage 2 (the film forming temperature of the wafer W) may be in the range of 300 to 700 degrees C. The temperature is preferably 400 to 700 degrees C., and more preferably 500 to 600 degrees C.

The pressure in the chamber 101 is determined on the basis of plasma damage, in-plane uniformity of the Ti film, and the like, and a preferable range thereof is 13.3 to 1333 Pa (0.1 to 10 Torr).

At the film forming temperature of 300 to 700 degrees C. described above, when the electrostatic chuck is not used as in the prior art, the wafer W is warped, and the warpage of the wafer W causes deterioration of uniformity, arcing between the wafer W and the stage, or the like.

In contrast, in the substrate holder 1 configured as described above, when a Ti film as a conductive film is formed, the formation of the conductive deposition film on the rear surface of the wafer W is avoided or reduced, which enables the electrostatic chuck function to be provided. In addition, since the Johnsen-Rahbek force having a high attraction force is used as the electrostatic attraction force, it is possible to reliably correct the warpage of the wafer W.

Other Applications

Although embodiments have been described above, it should be understood that the embodiments disclosed herein are illustrative and non-restrictive in all respects. The above-described embodiments may be omitted, replaced, or modified in various forms without departing from the scope and spirit of the appended claims.

For example, in the above-described embodiments, an example in which the support 3 that supports the stage 2 is provided as the substrate holder 1 has been illustrated. However, the stage 2 may be provided directly on the bottom portion of the chamber without providing the support 3.

In addition, in the above-described embodiments, an example in which a semiconductor wafer as a substrate is placed on the stage has been illustrated. However, without being limited thereto, for example, the surface of the stage may be mad to face downwards, the substrate may be supported on the surface, and the substrate may be attached and held by electrostatic adsorption.

Furthermore, although an example in which a semiconductor wafer is used as a substrate has been illustrated, the substrate is not limited to the wafer, but may be another substrate to be substrate, such as an FPD substrate. In the case in which the substrate has a rectangular shape like an FPD substrate, the close contact area and the groove may have a frame shape.

Furthermore, the film forming apparatus is merely an example, and is not particularly limited as long as it is a film forming apparatus using plasma. The plasma generation method is also arbitrary.

According to the present disclosure, a substrate holder capable of electrostatically attracting a substrate when a conductive film is formed by plasma CVD or plasma ALD, and a film forming apparatus using the same are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate holder for holding a substrate when a conductive film is formed by plasma CVD or plasma ALD, the substrate holder comprising:
    a stage made of a dielectric material and configured to support the substrate;
    an attraction electrode provided in the stage and configured to electrostatically attract the substrate; and
    a heater configured to heat the stage,
    wherein, by applying a DC voltage to the attraction electrode, the substrate is electrostatically attached to a surface of the stage by a Johnsen-Rahbek force,
    wherein the stage comprises:
    an annular close contact area with which the substrate comes into close contact at a position corresponding to an outer periphery of the substrate on the surface of the stage such that a raw material gas for forming the conductive film is prevented from flowing to a rear side of the substrate;
    a groove provided in an annular shape in a portion outside the close contact area, wherein a conductive deposition film formed by the raw material gas is accumulated in the groove; and
    an attraction surface comprising an entire area enclosed by the annular close contact area and formed to be lower than the annular close contact area, and
    wherein the substrate holder further comprises a backside gas supply having a gas inlet formed in the attraction surface such that a backside gas for heat transfer is supplied to a space between the substrate and the attraction surface.

2. The substrate holder of claim 1, wherein the close contact area has a width of 10 to 40 mm.

3. The substrate holder of claim 2, wherein the groove has a depth of 20 to 100 μm from the close contact area, and a width of 0.5 to 2 mm.

4. The substrate holder of claim 3, wherein a temperature of the surface of the stage heated by the heater is 200 degrees C. or higher.

5. The substrate holder of claim 1, wherein the groove has a depth of 20 to 100 μm from the close contact area, and a width of 0.5 to 2 mm.

6. The substrate holder of claim 1, wherein a temperature of the surface of the stage heated by the heater is 200 degrees C. or higher.

7. The substrate holder of claim 6, wherein the temperature of the surface of the stage heated by the heater is 400 to 700 degrees C.

8. The substrate holder of claim 1, wherein the backside gas supply is configured to set a gas pressure of the backside gas to 20 to 100 Torr.

9. The substrate holder of claim 1, wherein the attraction electrode serves as a ground electrode for plasma.

10. The substrate holder of claim 7, wherein the dielectric material is configured to have a volume resistivity of about $1 \times 10^9$ to $1 \times 10^{12}$ Ω·cm when the temperature of the surface of the stage is 400 to 700 degrees C.

11. The substrate holder of claim 10, wherein the dielectric material is AlN.

12. The substrate holder of claim 1, wherein a distance from the attraction electrode to an attraction surface of the substrate, which is attached to the stage, is 0.5 to 1.5 mm.

13. The substrate holder of claim 1, wherein a distance between the attraction electrode and the conductive deposition film formed outside the close contact area is greater than a distance from the attraction electrode to an attraction surface of the substrate, which is attached to the stage.

14. The substrate holder of claim 13, further comprising:
an auxiliary electrode configured to spread plasma outside the attraction electrode,
wherein a distance between the auxiliary electrode and the conductive deposition film is greater than a distance from the attraction electrode to the attraction surface of the substrate, which is attached to the stage.

15. The substrate holder of claim 1, further comprising a support installed on a center of a bottom side of the stage to extend downwards.

16. A film forming apparatus for forming a conductive film by plasma CVD or plasma ALD, the film forming apparatus comprising:
a chamber in which film forming processing is performed;
the substrate holder of claim 1 that is provided in the chamber;
a gas introduction part configured to introduce gas for forming the conductive film into the chamber;
a plasma generator configured to generate plasma in the chamber; and
an exhauster configured to evacuate an inside of the chamber.

17. The film forming apparatus of claim 16, wherein the gas introduction part includes a shower head configured to introduce the gas into the chamber in a shower form, and
the plasma generator includes a high-frequency power supply configured to apply high-frequency power to the shower head.

18. The film forming apparatus of claim 16, wherein a Ti raw material gas and a reducing gas are used as the gas for forming the conductive film to form a Ti film as the conductive film.

19. The film forming apparatus of claim 18, wherein $TiCl_4$ gas is used as the Ti raw material gas, and $H_2$ gas is used as the reducing gas.

* * * * *